(12) United States Patent
Lee et al.

(10) Patent No.: US 9,407,062 B2
(45) Date of Patent: Aug. 2, 2016

(54) WAVELENGTH-MAINTAINING FABRY-PEROT LASER DIODE AND OPTICAL TRANSMITTER INCLUDING SAME

(71) Applicant: Korea Advanced Institute of Science and Technology, Daejeon (KR)

(72) Inventors: Chang-Hee Lee, Dajeon (KR); Joon-Young Kim, Daejeon (KR); Sang-Rok Mun, Mokpo-si (KR); Sang-Hwa Yoo, Gumi-si (KR); Byungil Seo, Daegu (KR); Myeonggyun Kye, Seoul (KR); Jian Chang, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 14/411,262

(22) PCT Filed: Dec. 15, 2012

(86) PCT No.: PCT/KR2012/010974
§ 371 (c)(1),
(2) Date: Dec. 24, 2014

(87) PCT Pub. No.: WO2014/003264
PCT Pub. Date: Jan. 3, 2014

(65) Prior Publication Data
US 2015/0288137 A1  Oct. 8, 2015

(30) Foreign Application Priority Data

Jun. 25, 2012  (KR) .................. 10-2012-0067877

(51) Int. Cl.
| H01S 3/10 | (2006.01) |
| H01S 5/026 | (2006.01) |
| H01S 5/0625 | (2006.01) |
| H01S 5/042 | (2006.01) |
| H01S 5/062 | (2006.01) |

(52) U.S. Cl.
CPC ............. *H01S 5/0265* (2013.01); *H01S 5/0425* (2013.01); *H01S 5/06246* (2013.01); *H01S 5/06255* (2013.01); *H01S 5/06256* (2013.01)

(58) Field of Classification Search
CPC ............. H01S 5/0265; H01S 5/06246; H01S 5/06255; H01S 5/0425
See application file for complete search history.

(56) References Cited

U.S. PATENT DOCUMENTS

| 6,337,868 | B1 * | 1/2002 | Mizutani ...................... 372/27 |
| 6,807,201 | B1 * | 10/2004 | Nitta ........................... 372/29.02 |
| 2009/0060526 | A1 * | 3/2009 | Matsui et al. ................ 398/185 |
| 2011/0110388 | A1 * | 5/2011 | Baroni et al. .................. 372/26 |

* cited by examiner

*Primary Examiner* — Yuanda Zhang
(74) *Attorney, Agent, or Firm* — Lee, Hong, Degerman, Kang & Waimey; Jonathan Kang; Harry Lee

(57) ABSTRACT

A wavelength tracking Fabry-Perot Laser Diode (F-P LD), and an optical transmitter including the same are disclosed, the wavelength keepable F-P LD including a gain section configured to provide and modulate a gain using an injected first current; and a phase shift/modulation section configured to vary wavelength relative to oscillation mode of light advanced from the gain section by injected second current or voltage and to modulate phases.

3 Claims, 11 Drawing Sheets

WAVELENGTH-MAINTAINING FABRY-PEROT LASER DIODE AND OPTICAL TRANSMITTER INCLUDING SAME

STATEMENT REGARDING GOVERNMENT SPONSORED RESEARCH

"This invention was made with grants from the MSIP (Ministry of Science, ICT & Future Planning) under Grant Subject Nos. 2014-PK 10-05 (Mar. 1, 2013-Feb. 29, 2016) and 2014-044-009-001 (Apr. 1, 2014-Feb. 28, 2017) awarded to KAIST (Korea Advanced Institute of Science and Technology)."

CROSS-REFERENCE TO RELATED APPLICATIONS

This application is the National Stage filing under 35 U.S.C. 371 of International Application No. PCT/KR2012/010974, filed on Dec. 15, 2012, which claims the benefit of earlier filing date and right of priority to Korean Patent Application No. 10-2012-0067877, filed on Jun, 25, 2012, the contents of which are all hereby incorporated by reference herein in their entirety.

TECHNICAL FIELD

The present invention relates to a semiconductor laser diode, and more particularly to a wavelength tracking Fabry-Perot Laser Diode (F-P LD), and an optical transmitter including a wavelength tracking F-P LD using an optical communication system.

BACKGROUND OF THE INVENTION

In general, a WDM network (Wavelength Division Multiplexed-Optical Network) has become recognized as an ultimate network capable of coping with explosive network traffic increase due to advantages capable of providing bandwidth catering to recently explosively increasing bandwidth demand.

Figure 1:
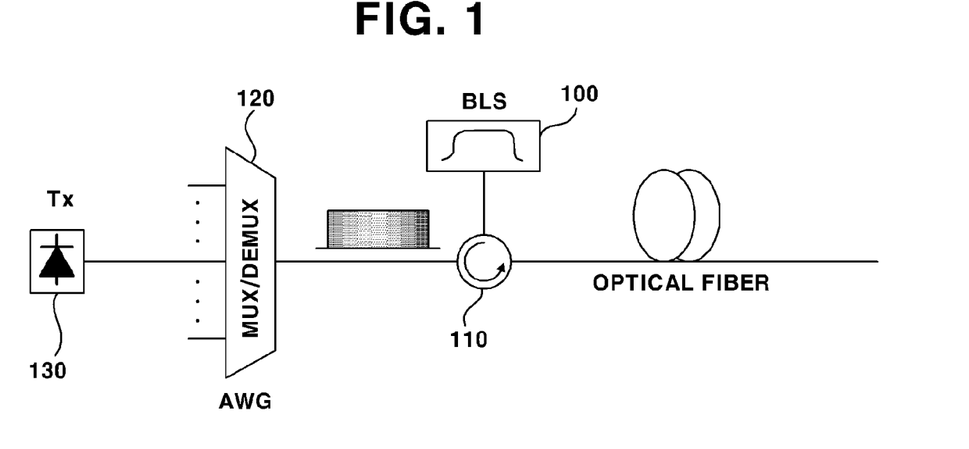
FIG. 1 is a schematic block diagram illustrating a general WDM-PON system.

FIG. 1 is a schematic block diagram illustrating a general WDM-PON system.

A broadband light outputted from a BLS (Broadband Light Source, 100 is spectrum-divided (filtered) after passing a demultiplexing AWB (Arrayed Waveguide Grating, 120) by passing through an optical circulator, 110). The spectrum-divided light is injected into an optical transmitter (Tx, 130). In general, the optical transmitter (130) of the WDM-PON system includes an F-P LD or an RSOA (Reflective Semiconductor Optical Amplifier). The F-P LD or the RSOA amplifies an injected light and simultaneously reduces noise, and modulates to a transmitted signal. Lights of mutually different wavelengths outputted from each channel are inputted to the AWG (120), where the AWG (120) multiplexes the lights. The multiplexed signals are transmitted through an optical fiber.

Figure 2A:
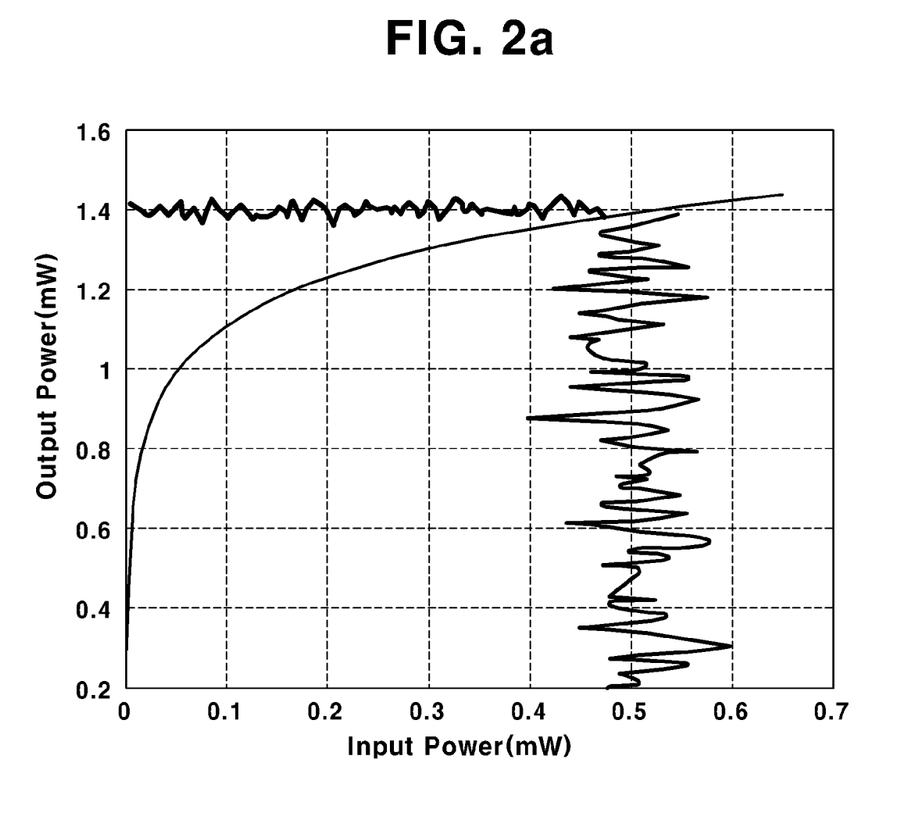
FIGS. 2A to 2E are exemplary views illustrating a device characteristic used for optical transmitter of a conventional WDM-PON system.

FIGS. 2A to 2E are exemplary views illustrating device characteristics used for optical transmitter in a WDM-PON system according to prior art. When a light is injected into an F-P LD/RSOA (131), a gain saturation phenomenon is generated where a gain is reduced in reverse proportionate to gain as intensity of light increases, as shown in FIG. 2A. Noise of injected light can be inhibited when using the gain saturation phenomenon.

Figure 2B:
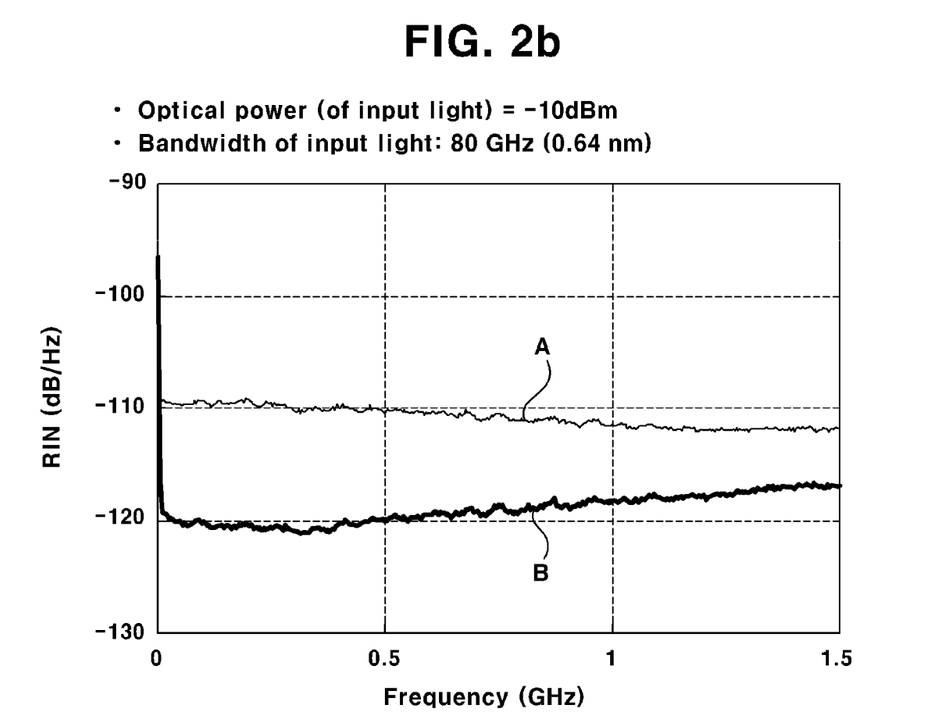

FIG. 2B illustrates an RIN (Relative Intensity Noise) in a frequency region, and it can be noted that when a light having an RIN of −110 dB/Hz and a power of −10 dBm is injected, noise is reduced by approximately 10 dB (A→B). That is, it can be confirmed that the noise is inhibited by approximately 1/10.

Figure 2C:
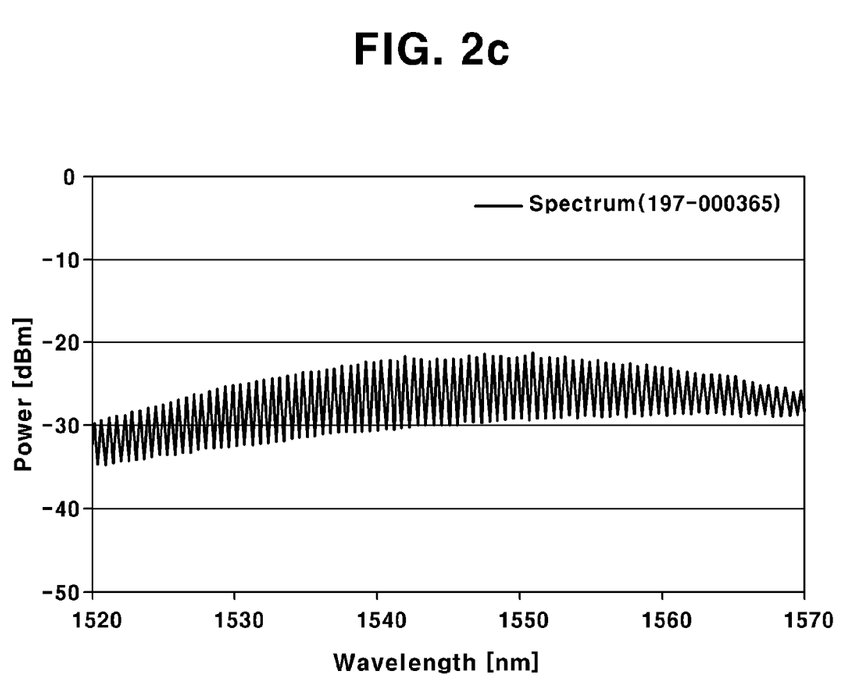
Figure 2D:
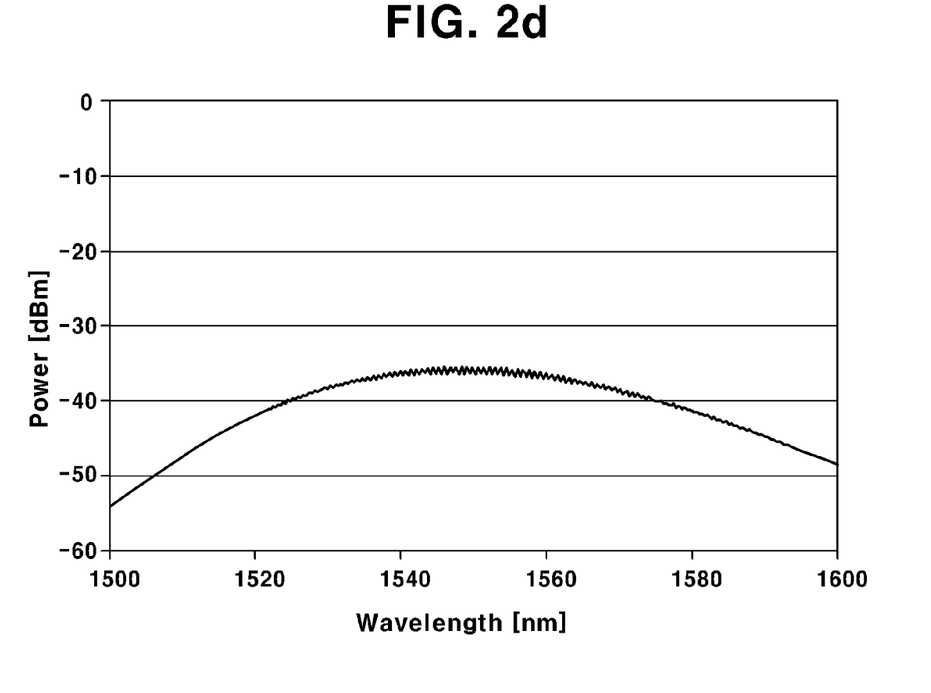

FIG. 2C illustrates an optical spectrum of F-P LD, and FIG. 2D illustrates an optical spectrum of RSOA. The F-P LD is a very general LD (Laser Diode) formed by a cavity formed by mirrors at both ends and a gain medium therebetween, and coated at the entire surface with anti-reflection coating (reflectance less than 0.1%(in order to inject the light. When the F-P LD is used for the optical transmitter (130), it can be noted as shown in FIG. 2C that a plurality of modes is formed by the cavity. Thus, the RSOA may be an F-P LD having a very low total reflectance (approximately 0.001%). As a result, as illustrated in FIG. 2D, it can be learned that the RSOA has almost no mode characteristic over F-P LD.

Figure 2E:
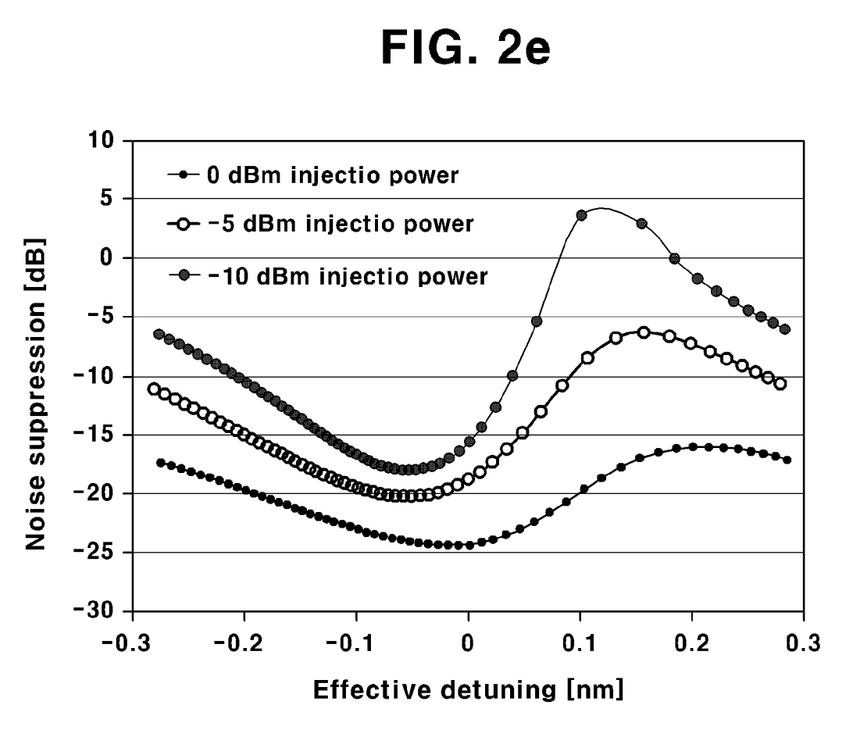

Meantime, the physical properties of optical transmitter (130) vary depending on relationship between wavelength ($\lambda_{INJ}$) of light injected from outside and wavelength ($\lambda_{F-P}$) of mode formed by cavity of F-P LD. FIG. 2E illustrates a result of degree of noise inhibited by detuning ($\lambda_{INJ}$-$\lambda_{F-P}$). Furthermore, an output light of F-P LD passes the AWG (120), where a frequency component is filtered (filtering effect) by pass characteristic of the AWG (120). At this time, an output spectrum of the F-P LD is changed by the detuning, whereby a frequency component filtered by the AWG (120) is resultantly changed to disadvantageously have an effect on the physical properties of the optical transmitter (130).

As noted above, as noise of the received optical signal is changed in response to the detuning, the physical properties deteriorate due to changed detuning when external environments such as temperature are changed even if operated under an optimal condition. Thus, power of injected light must be increased for color-free operation and to prevent the deteriorated physical properties. As a result, a high output powered BLS (100) must be used, which disadvantageously increases a power consumption of entire system to increase the price.

Meanwhile, although almost no influence is received by detuning when an RSOA is used, the RSOA lags behind in price competitiveness over the F-P LD to inevitably use a TEC, resulting in increased power consumption to a great extent. Korea Patent No.: 680918 (Feb. 2, 2007) is disclosed to provide a method for solving the detuning problem.

The Korea Patent No.: 680918 teaches three electrodes for injecting a current in the conventional F-P LD configuration, which are called triple contact F-P LD. The triple contact F-P LD can change a ratio of currents injected to each electrode to change wavelengths of a plurality of modes that oscillates by constantly maintaining an output power.

Figure 3A:
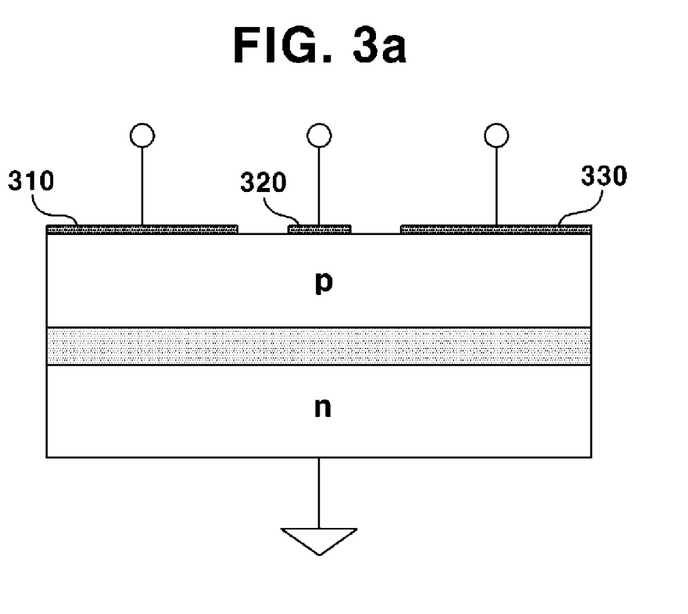
FIG. 3A is a schematic block diagram illustrating a conventional triple contact F-P LD.
Figure 3B:
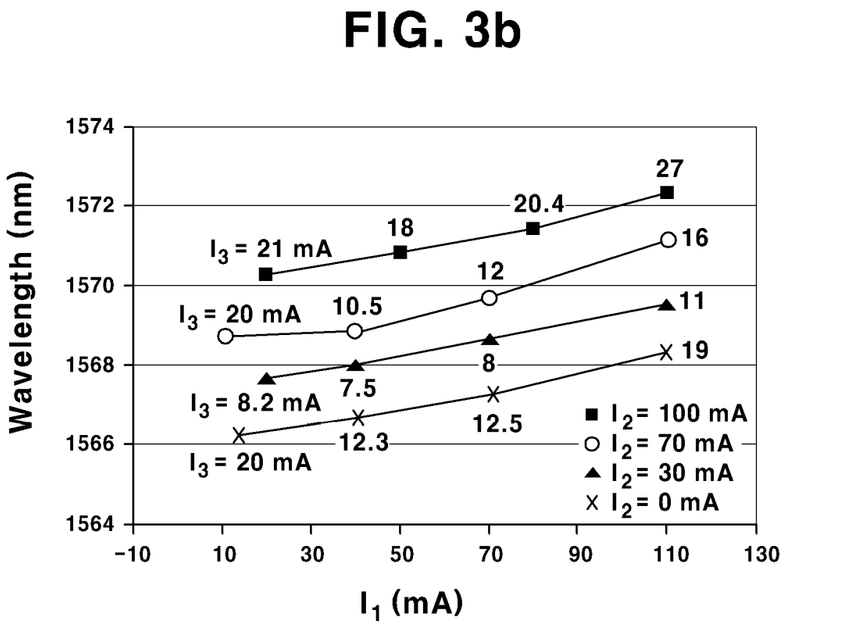
FIG. 3B is a schematic view illustrating a position of an oscillation mode in response to a current injection to each electrode of a triple contact F-P LD.

FIG. 3A is a schematic view illustrating a configuration of triple contact F-P LD according to prior art, and FIG. 3B is a schematic view illustrating a position of oscillation mode in response to a current injected to each electrode of the triple contact F-P LD in FIG. 3A, where $I_1$ is a current injected to a first electrode (310), $I_2$ denotes a current injected to a second electrode (320), and $I_3$ denotes a current injected to a third electrode (330).

However, the triple contact F-P LD according to the prior art cannot satisfy a scope of wavelength keeping capable of coping with a broad temperature change of an actual field when a change rate (0.1 nm/° C.) in response to the temperature is considered.

Meantime, when a coherent light and incoherent light are injected from outside, and when oscillation wave of F-P LD and injection wave are matched, the F-P LD that has oscillated in multiple modes oscillates in a single mode at the injected wavelength. At this time, when the external temperature is changed to change the oscillation wavelength of the laser, laser characteristics are changed, and the F-P LD returns to multiple mode, and becomes difficult to be used for WDM. Thus, the laser can track the transmission characteristics, only when oscillation wavelength is changed to keep oscillating at an originally oscillated wavelength and to allow tracking the oscillation wavelength. This requirement is particularly important when the oscillation wavelength spacing of F-P LD is broader than line width of injected light. Thus, the wavelength tracking is essential to realize the colorless characteristic by applying the F-P LD to super high speed WDM system.

When a modulator-integrated reflective semiconductor optical amplifier is manufactured, a colorless light source capable of high speed modulation free from wavelength tracking can be realized. However, the reflective semiconductor optical amplifier must be attached with a TEC because the reflective semiconductor optical amplifier is narrow in operating wavelength scope and high in operating current. Although this may be thought as one of subclasses of wavelength tracking F-P LD, it is difficult to remove the TEC.

Meantime, the current optical communication system uses various modulation methods {QPSK (Quadrature Phase Shift Keying), DQPSK (Differential Quadrature Phase Shift Keying, QAM (Quadrature Amplitude Modulation)} capable of simultaneously performing the phase modulation and intensity modulation. However, an external modulator used for this purpose is disadvantageously expensive, and low in competitiveness in terms of maintenance/repair. Thus, it is imperative that a light source capable of accommodating various modulation methods be developed while operable in colorless operation.

SUMMARY OF THE DISCLOSURE

The present disclosure is provided to solve the aforementioned conventional problems and the present disclosure provides a wavelength tracking Fabry-Perot Laser Diode (F-P LD) capable of performing a colorless operation while accommodating various modulation methods.

The present disclosure also provides an optical transmitter including a wavelength keepable F-P LD wavelength tracking Fabry-Perot Laser Diode (F-P LD) capable of performing a colorless operation while accommodating various modulation methods.

In one general aspect of the present disclosure, there is provided a wavelength tracking Fabry-Perot Laser Diode (F-P LD), the wavelength keepable F-P LD comprising:
a gain section configured to provide and modulate a gain using an injected first current; and
a phase shift/modulation section configured to vary wavelength relative to oscillation mode of light advanced from the gain section by injected second current or voltage and to modulate phases, wherein each of the gain section and the phase shift/modulation section includes active layers of mutually different refractive indexes, and the active layer of the gain section and the phase shift/modulation section is formed with a material not absorbent of the light advanced from the gain section.

Preferably, but not necessarily, the gain section may include a first electrode, a P-type or N-type first semiconductor layer, a first active layer, a second semiconductor layer having a polarity opposite to that of the first semiconductor layer, and a stacked structure sequentially stacked with second electrodes, wherein intensity of injected light is modulated by a first current injected to the first electrode.

Preferably, but not necessarily, the gain section may further include first and second intermediate layers between the first semiconductor layer and the first active layer, and between the first active layer and the second semiconductor layer in order to increase a light emitting efficiency.

Preferably, but not necessarily, the phase shift/modulation section may include a stacked structure sequentially stacked with a third electrode, a P type or N type third semiconductor layer, a second active layer, a fourth semiconductor layer having a polarity opposite to that of the third semiconductor layer, and a fourth electrode, wherein the third electrode and the first electrode are mutually insulated by being discrete from each other.

Preferably, but not necessarily, the third and fourth electrodes may be formed with one conductive material.

Preferably, but not necessarily, the phase shift/modulation section may further include third and fourth intermediate layers between the third semiconductor layer and the second active layer, and between the second active layer and the fourth semiconductor layer in order to increase a light emitting efficiency.

Preferably, but not necessarily, the wavelength relative to oscillation mode of light advanced from the gain section may be varied by change of second current or voltage injected from the third electrode.

Preferably, but not necessarily, the phase of light advanced from the gain section may be varied by change of second current or voltage injected from the third electrode.

Preferably, but not necessarily, height of the second active layer may be substantially same as that of the first active layer.

Preferably, but not necessarily, the phase shift/modulation section may be formed with polymer or silicone In another general aspect of the present disclosure, there is provided a wavelength keepable Fabry-Perot Laser Diode (F-P LD), the wavelength keepable F-P LD comprising:
a gain section configured to provide and modulate a gain using an injected first current;
a phase shift section configured to keep a wavelength relative to oscillation mode of light using an injected second current;
a phase modulation section configured to modulate a phase of an output light using an injected third current; and
wherein each of the gain section and the phase shift and modulation section includes active layers of mutually different refractive indexes, and the active layer of the phase shift section is formed with a material not absorbent of the light advanced from the gain section.

Preferably, but not necessarily, the gain section, the phase shift section and the phase modulation section may be serially laminated.

Preferably, but not necessarily, the gain section may be spatially discrete from the phase shift section.

Preferably, but not necessarily, the gain section may include a stacked structure sequentially stacked with a first electrode, a P type or N type first semiconductor layer, a first active layer, a second semiconductor layer having a polarity opposite to that of the first semiconductor layer, and a second electrode, wherein intensity of injected light is modulated by a first current injected to the first electrode.

Preferably, but not necessarily, the phase shift section may include a stacked structure sequentially stacked with a third electrode, a first polymer layer, a second active layer, a second polymer layer and a fourth electrode, wherein the third electrode and the first electrode are mutually insulated by being discrete from each other.

Preferably, but not necessarily, the phase modulation section may include a stacked structure sequentially stacked with a fifth electrode, a third polymer layer, a third active layer, and a sixth electrode, wherein the second and third active layers are active layers of same material.

ADVANTAGEOUS EFFECTS

The present disclosure has an advantageous effect in that a section for phase shift is inserted into a general F-P LD structure to allow having a broader wavelength keeping scope and enabling intensity and phase modulation.

DETAILED DESCRIPTION

Various exemplary embodiments will be described more fully hereinafter with reference to the accompanying drawings, in which some exemplary embodiments are shown.

The present inventive concept may, however, be embodied in many different forms and should not be construed as limited to the example embodiments set forth herein. Rather, the described aspect is intended to embrace all such alterations, modifications, and variations that fall within the scope and novel idea of the present disclosure.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

It will be understood that when an element is referred to as being "connected" or "coupled" to another element, it can be directly connected or coupled to the other elements or intervening elements may be present. In contrast, when an element is referred to as being "directly connected" or "directly coupled" to another element, there are no intervening elements present.

The terminology used herein is for the purpose of describing particular embodiments only and is not intended to be limiting of the general inventive concept. As used herein, the singular forms "a", "an" and "the" are intended to include the plural forms as well, unless the context clearly indicates otherwise.

It will be understood that the terms "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. That is, the terms "including", "includes", "having", "has", "with", or variants thereof are used in the detailed description and/or the claims to denote non-exhaustive inclusion in a manner similar to the term "comprising".

The present disclosure proposes a wavelength keepable F-P LD structure to allow having a broader wavelength keeping scope and enabling intensity and phase modulation.

Now, exemplary embodiments of the present disclosure will be described in detail with reference to the accompanied drawings.

Figure 4:
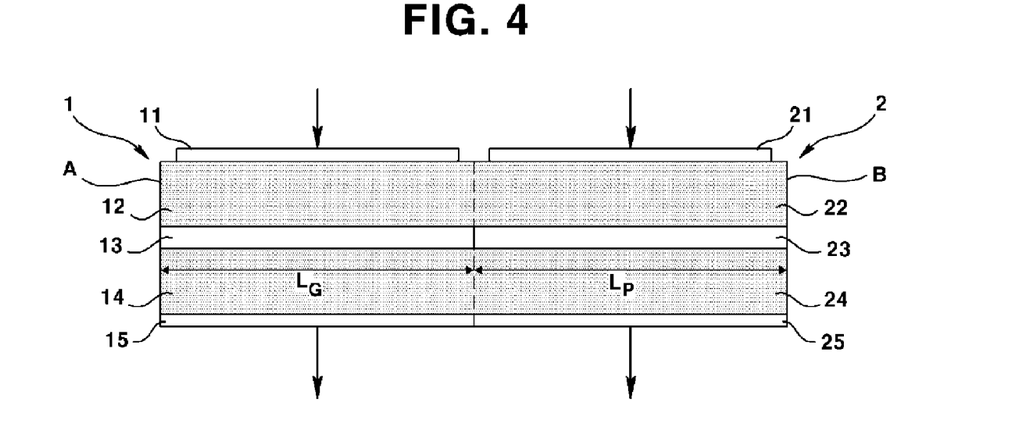
FIG. 4 is a cross-sectional view illustrating a wavelength keepable F-P LD according to a first exemplary embodiment of the present disclosure.

FIG. 4 is a cross-sectional view illustrating a wavelength keepable F-P LD according to a first exemplary embodiment of the present disclosure.

Referring to FIG. 4, the wavelength keepable F-P LD according to a first exemplary embodiment of the present disclosure includes a gain section (1) and a phase shift/modulation section (2), each laminated in series. It should be apparent to the skilled in the art that a cross-section of the wavelength keepable F-P LD according to the present disclosure is a mirror (A, B).

The gain section (1) includes, as a general F-P LD, a first electrode (11), a P type or N type polarity first semiconductor layer (12), an active layer (13), a second semiconductor layer (14) having a polarity opposite to that of the first semiconductor (12), and a second electrode (15), for example. When a current is injected to the first electrode (11) of the gain section (1), a gain is provided to an injected light. Furthermore, the gain section (1) may simultaneously perform an intensity modulation.

Although it is not illustrated, the gain section may further include an intermediate layer respectively formed in between the active layer (13), the first semiconductor layer (12) and the second semiconductor layer (14) in order to increase a light emitting efficiency. The active layer (13) is a layer where an injected light is oscillated, and may be configured in various shapes such as quantum well, quantum wire and quantum dot, for example.

The phase shift/modulation section (2) may include a first electrode (21), a P type or N type polarity first semiconductor layer (22), an active layer (23), a second semiconductor layer (24) having a polarity opposite to that of the first semiconductor (22) and a second electrode (25). Although FIG. 4 illustrates a configuration in which the second electrode (15) of gain section (1) and the second electrode (25) of phase shift/modulation section (2) are separately formed, it is an exemplary and the present disclosure may be realized using a same electrode. An intermediate layer may be inserted into in between the active layer (23), the first semiconductor layer (22) and the second semiconductor layer (24) respectively.

The gain section (1), the first semiconductor layers (12, 22) of the phase shift/modulation section (2), the active layers (13, 23) and the second semiconductor layers (14, 24) may be formed with a same height so as to be mutually laminated.

The phase shift/modulation section (2) can provide a broader wavelength keeping scope using a current or a voltage injected through the first electrode (21). For example, the wavelength keeping scope may be more than 12 nm. Furthermore, the phase shift/modulation section (2) can provide a phase modulation through a current injected through the first electrode (21). At this time, a space between the first electrodes (11, 21) must be electrically isolated in order to interrupt a leakage current due to a voltage difference between the gain section (1) and the first electrodes (11, 21) of the phase shift/modulation section (2). For example, the isolation may be performed by etching, but the present disclosure is not limited thereto.

Now, the intensity modulation of the gain section (1) and the phase shift modulation of the phase shift/modulation section (2) will be described in detail.

Figure 5:
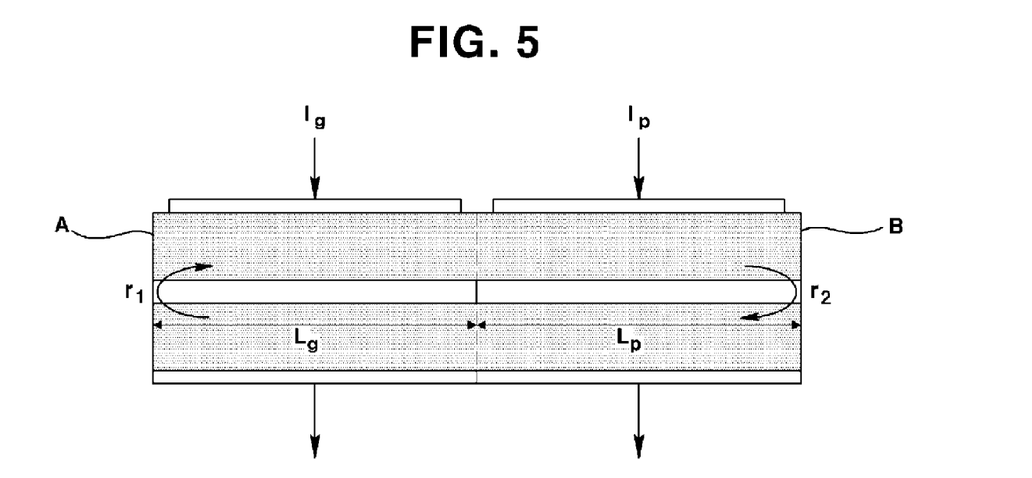
FIG. 5 is an exemplary view illustrating a round trip of electric field in the F-P LD in FIG. 4.

FIG. 5 is an exemplary view illustrating a round trip of electric field in the F-P LD in FIG. 4.

Referring to FIG. 5, it is assumed that a current inputted to the first electrode (11) of gain section (1) is $I_g$, a current inputted to the first electrode (21) of the phase shift/modulation section (2) $I_p$, and reflective index of each cross-section is reflectivity defined as $r_1$ and $r_2$. In general, the following Equation must be satisfied in order for an F-P LD to reach a threshold.

$$r_1 r_2 e^{-2j\tilde{\beta}_{gth}L_g} e^{-2j\tilde{\beta}_{pth}L_p} = 1 \quad \text{[Equation 1]}$$

A gain portion of the above Equation 1 may be as per the following Equation 2 and a phase portion may be as per the following Equation 3.

$$r_1 r_2 e^{(\Gamma g_{th} - \alpha_g)L_g} e^{-\alpha_p L_p} = 1 \quad \text{[Equation 2]}$$

$$e^{(2j\beta_{gth}L_g)} e^{(2j\beta_{pth}L_p)} = 1 \quad \text{[Equation 3]}$$

That is, the Equation 2 is a magnitude of electric filed in relation to a gain, where $\Gamma g_{th}$ is a gain obtained by the gain section (1) during round trip, $\alpha_g$ is a loss of the gain section (1) and $\alpha_p$ ≒ is a loss of the phase shift/modulation section (2). That is, the Equation 2 defines that a loss and a gain must be equal that are obtained when a certain electric field performs a round trip in an F-P LD, which is a basic characteristic for an LD to operate.

At this time, when a current is injected from outside, a carrier density increases to increase a gain. If the injected current $I_g$ grows above a threshold current, the gain becomes $g_{th}$ to be lased.

Thus, when the current $I_g$ injected to the gain section (1) is modulated, a result just like the gain being modulated can be obtained, whereby the intensity of light outputted from the F-P LD of the present disclosure can be modulated.

Meantime, $\beta_{gth}$ in the Equation 3 is a propagation constant of the gain section (1), which is a parameter that determines how much a phase per unit length is shifted. Thus, the Equation 3 means that a phase during one time round trip must be equal to that before the round trip. When the Equation 3, if simplified, may be changed to a condition determining a wavelength $\lambda_{th}$ of a mode as in Equation 4.

$$\lambda_{th} = \frac{2}{m}[\bar{n}_g L_g + \bar{n}_p L_p] \quad \text{[Equation 4]}$$

where, m is an integer, and $\bar{n}_g$ and $\bar{n}_p$ are respectively an effective index of gain section and phase shift/modulation section (2). When the gain reaches $g_{th}$, the $\bar{n}_g$ being of almost no change, when $\bar{n}_p$ is tuned a wavelength of oscillation mode can be varied. At this time $\bar{n}_p$ is a changed in response to a carrier density, an electro-optic effect or a thermo-optic, such that when a current is injected to the phase shift/modulation section (2), $\bar{n}_p$ is changed to adjust the wavelength of mode.

That is, the F-P LD of the present disclosure can perform an intensity modulation of outputted light by modulating the current $I_g$ injected to the gain section (1), and phase modulation of outputted light can be performed by modulating a current $I_p$ (or voltage) injected to the phase shift/modulation section (2). In other words, the injection light increases (intensity modulation) in terms of gain by the current $I_g$, injected to the gain section (1) and a light inputted to the phase shift/modulation section (2) from the gain section (1) is modulated in terms of phase by the current $I_p$ injected to the phase shift/modulation section (2).

The active layer (23) of the phase shift/modulation section (2) according to the present disclosure is preferably transparent relative to a light of a band corresponding to an injection light so that a light advanced from gain section (1) can pass therethrough. That is, the active layer (23) is preferably made of a material not absorbent of light of a relevant band.

For example, the gain section (1) and active layers (13, 23) of the phase shift/modulation section (2) are respectively made of GaAs and AlGaAs, and have an effective index a bit different relative to a band of the injection light. Furthermore, the gain section (1) and active layers (13, 23) of the phase shift/modulation section (2) may have different combinations in each component of InGaAsP, where the active layer (23) of the phase shift/modulation section (2) may be transparent to a light of a band corresponding to the injection light, and different in effective index from the active layer (1'3) of the gain section (1). However, the above description is exemplary and therefore, it should be apparent that the materials of the gain section (1) and the active layers (13, 23) of the phase shift/modulation section (2) are not limited thereto. Thus, a broader wavelength (more than 12 nm) keeping is enabled by the active layer (23) of the abovementioned phase shift/modulation section (2) and at the same time, a phase modulation is also enabled. The term of wavelength keeping means that an oscillation wavelength is not changed and kept unchanged by changing a current or a voltage of the phase shift/modulation section (2) when the oscillation wavelength is changed by changed external temperature. That is, the oscillation wavelength can be kept unchanged by changing a current or a voltage of the phase shift/modulation section (2), even if external temperature is changed to change the oscillation wavelength. To be more specific, the oscillation wavelength can be kept even if the 12 nm wavelength is changed by an external temperature.

Thus, when an incoherent light is injected, oscillation mode of the F-P LD according to the present disclosure is changed in response to wavelength of injection light to keep an optimal condition. Furthermore, when a coherent light is injected, a variety of modulation methods may be provided using the intensity modulation through modulation of injection current of the gain section (1) and phase modulation through modulation of injection current of the phase shift/modulation section (2) or modulation of voltage.

Figure 6:
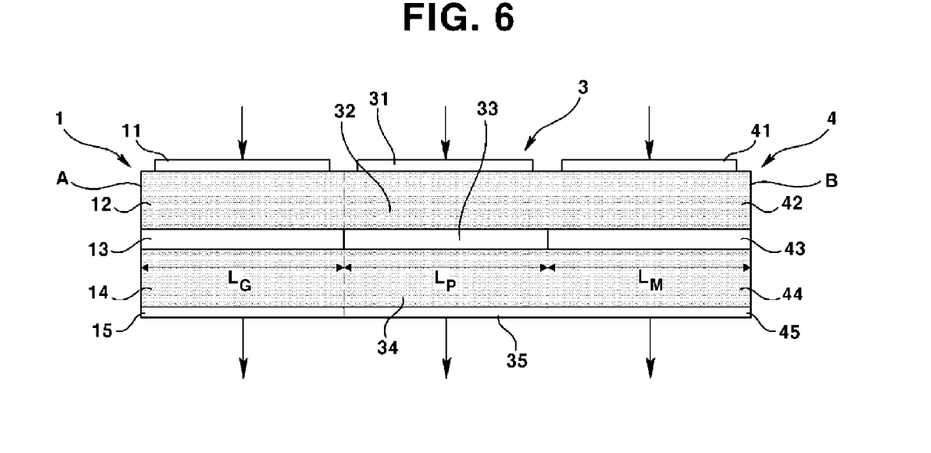
FIG. 6 is a cross-sectional view illustrating a wavelength keepable F-P LD according to a second exemplary embodiment of the present disclosure.

FIG. 6 is a cross-sectional view illustrating a wavelength keepable F-P LD according to a second exemplary embodiment of the present disclosure.

Referring to FIG. 6, the wavelength keepable F-P LD according to a second exemplary embodiment of the present disclosure may be formed by a serial lamination of a gain section (1), a phase shift section (3) and a modulation section (4), and mirrors (A, B) are formed across a cross-section.

In the second exemplary embodiment of the present disclosure, an intensity modulation is provided through the gain section (1), a wavelength keeping is enabled relative to a mode through the phase shift section (3), and a phase modulation is provided through the modulation section (3).

The gain section (1) according to the second exemplary embodiment of the present disclosure is same as the gain section (1) described through FIG. 4 such that no further elaboration will be made thereto.

The phase shift section (3) in the F-P LD according to the second exemplary embodiment of the present disclosure, unlike the first exemplary embodiment of FIG. 4, can perform only the wavelength keeping function relative to the oscillation mode, and the phase modulation is performed by the phase modulation section (4).

That is, the wavelength keeping may be performed relative to the oscillation mode of the F-P LD using a current or a voltage injected to the phase shift section (3), and a phase modulation may be performed using a current or a voltage injected to the phase shift section (4).

An active layer (33) of the phase shift section (3) is preferably transparent to a light of a band corresponding to an injection light to allow a light advanced from the gain section (1) to pass therethrough. That is, the active layer (33) is preferably made of a material not absorbent of light of a relevant band. Thus, the active layer (33) of the phase shift section (3) is, as in the exemplary embodiment of FIG. 4, may be formed with a material having an effective index different from that of the active layer (13) of the gain section (1). However, an active layer (43) of the phase shift section (4) may be same as the active layer (13) of the gain section (1), or same as the active layer (33) of the phase shift section (3) in terms of material.

Figure 7:
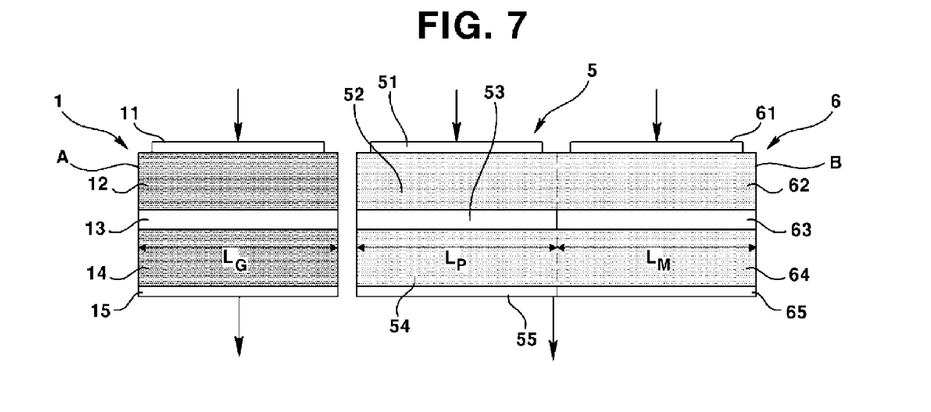
FIG. 7 is a cross-sectional view illustrating a wavelength keepable F-P LD according to a third exemplary embodiment of the present disclosure.
Figure 8:
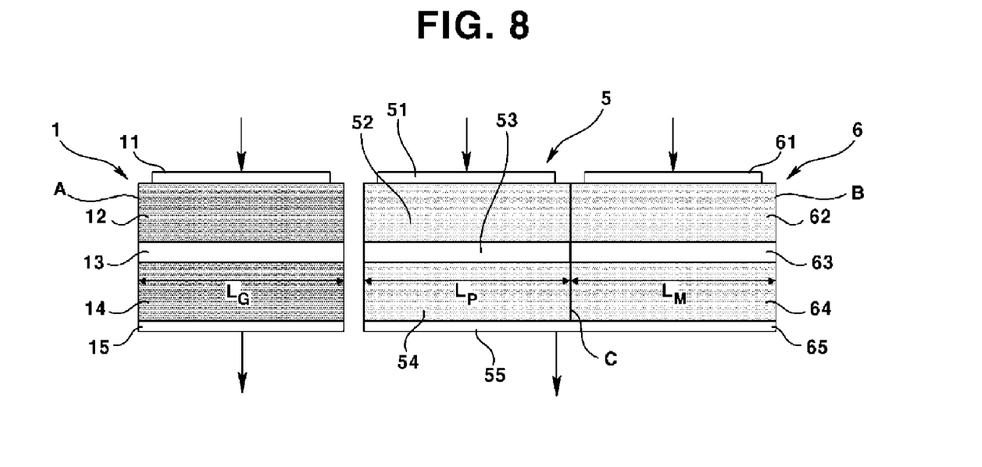
FIG. 8 is a cross-sectional view illustrating a wavelength keepable F-P LD according to a fourth exemplary embodiment of the present disclosure.

FIG. 7 is a cross-sectional view illustrating a wavelength keepable F-P LD according to a third exemplary embodiment of the present disclosure, and FIG. 8 is a cross-sectional view illustrating a wavelength keepable F-P LD according to a fourth exemplary embodiment of the present disclosure.

Referring to FIGS. 7 and 8, the wavelength keepable F-P LD according to the third and fourth exemplary embodiments of the present disclosure may include a gain section (1), a phase shift section (5) and a phase shift section (6).

The gain section (1) according to the third and fourth exemplary embodiments of the present disclosure is same as what is described in the second exemplary embodiment such that no further elaboration will be made thereto. Furthermore, although the phase shift section (5) and the phase modulation section (6) are differently provided with reference numerals, a detailed configuration is almost similar to that described with reference to the second exemplary embodiment.

The only difference between the wavelength keepable F-P LD according to the third and fourth exemplary embodiments of the present disclosure and that of the second exemplary embodiment of the present disclosure is that the phase shift section (5) and the phase modulation section (6) uses a medium less in loss. That is, the phase shift section (5) and the phase modulation section (6) is free from semiconductors, and uses polymer or silicone, which may be used as being a bit separated from the gain section (1). It should be apparent however that the type of medium thus described is not limited thereto.

The difference between the third exemplary embodiment of FIG. 7 and the fourth exemplary embodiment of FIG. 8 is that the F-P LD according to the third exemplary embodiment of FIG. 7 is provided with mirrors across the cross section (A, B), while the F-P LD according to the fourth exemplary embodiment of FIG. 8 is provided with mirrors between one distal end (A) of the gain section (1) and a space (C) between the phase shift section (5) and the phase modulation section (6).

That is, the phase modulation section (6) according to the fourth exemplary embodiment may be positioned outside of laser and not influenced by characteristic of laser to thereby allow performing the modulation only.

Figure 9:
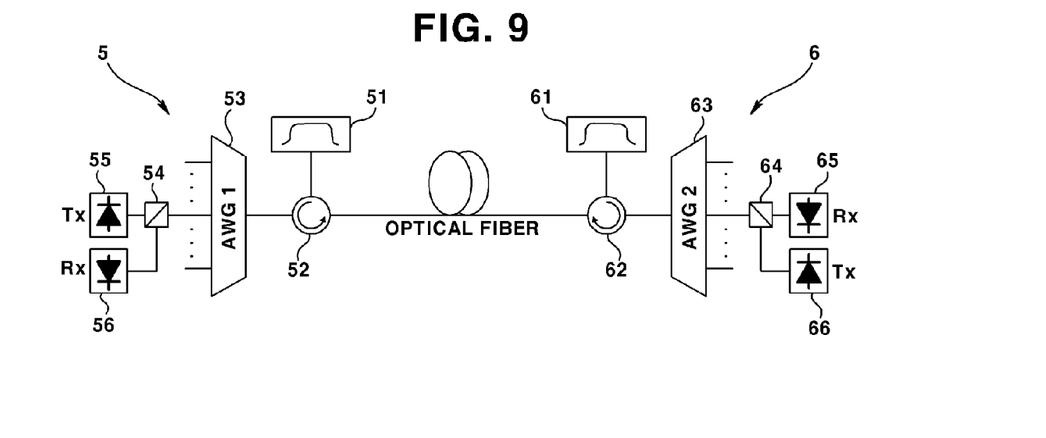
FIG. 9 is a block diagram illustrating a WDM system using a wavelength keepable F-P LD according to an exemplary embodiment of the present disclosure.

FIG. 9 is a block diagram illustrating a WDM (Wavelength Division Multiplexing; WDM) system using a wavelength keepable F-P LD according to an exemplary embodiment of the present disclosure, where a case of an injection seeded light source being injected is illustrated, and a WDM-PON system formed with a transmitter (50) and a receiver (60) is illustrated.

Referring to FIG. 9, a broad-spectrum light outputted from an MWL (Multi-Wavelength Laser) of the transmitter (50) or from ASE (Amplified Spontaneous Emission, 51) is inputted to an AWG (53) via a circulator (52), and a light wavelength-divided by the AWG (53) is injected to the F-P LD of the present disclosure included in an optical transmitter (55) via a WDM filter (54).

Thus, control is so made as to keep the detuning at an optimal condition by the phase shift/modulation section (2) or the phase shift section (3)/modulation section (4) of output mode according to the wavelength keepable F-P LD of the present disclosure, and the injected light is simultaneously modulated.

The receiver (60) may also have the same configuration as that of the transmitter (50), where it should be apparent to the skilled in the art that the transmitter and the receiver (60) perform a bidirectional communication using mutually different wavelengths. Thus, it should be also apparent to the skilled in the art that the receiver (60) may include an optical transmitter (66) including the wavelength keepable F-P LD.

Figure 10:
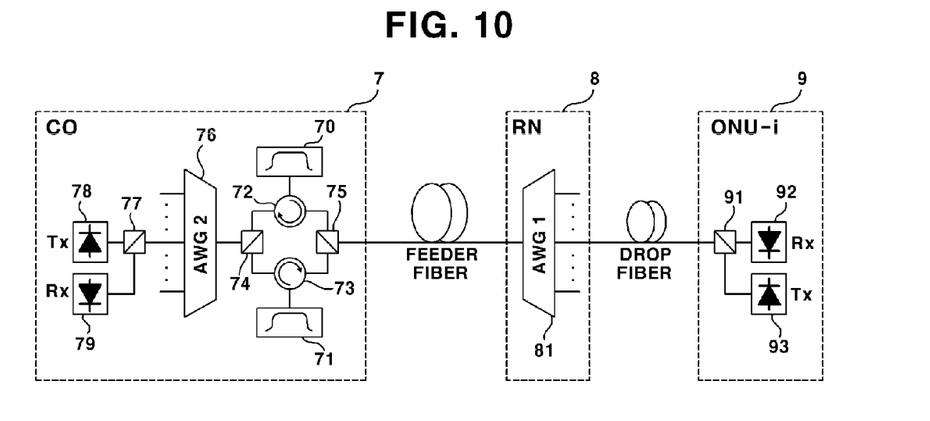
FIG. 10 is a block diagram illustrating a WDM-PON system using a wavelength keepable F-P LD according to an exemplary embodiment of the present disclosure.

FIG. 10 is a block diagram illustrating a WDM-PON system using a wavelength keepable F-P LD according to an exemplary embodiment of the present disclosure.

In view of the fact that a light source cannot be positioned on a RN (Remote Node, 8) in a FTTH (Fiber to the home) structured WDM-PON system, up/down injection light sources are all positioned at a CO (Central Office, 7) as shown in FIG. 8.

In case of uplink transmission, a light outputted from C band MWL/ASE(70) is wavelength-divided by AWG1 (81) of RN (8) through a feeder fiber, and then injected to the wavelength keepable F-P LD of an optical transmitter (93) of ONU (Optical Network Section, 9) via a drop fiber. An optical signal outputted from the wavelength keepable F-P LD according to the present disclosure is received by an optical transmitter (79) of CO (7) by being upstream-transmitted.

An explanation on downstream transmission will be omitted in detailed description due to being same as in the WDM-PON system of FIG. 7.

Although the present disclosure has been described with reference to a number of illustrative embodiments thereof, it should be understood that numerous other modifications and embodiments can be devised by those skilled in the art that will fall within the spirit and scope of the principles of this disclosure.

Therefore, it should be understood that the above-described embodiments are not limited by any of the details of the foregoing description, unless otherwise specified, but rather should be construed broadly within the scope as defined in the appended claims

INDUSTRIAL APPLICABILITY

The present disclosure is applicable to an optical transmitter including a wavelength keepable F-P LD using a wavelength keepable Fabry-Perot Laser Diode and optical transmission system.

What is claimed is:

1. A wavelength keeping Fabry-Perot Laser Diode (F-P LD), the wavelength keeping F-P LD comprising:
    a gain section configured to provide and modulate a gain using an injected first current;
    a phase shift section configured to keep a wavelength relative to an oscillation mode of light using an injected second current; and
    a phase modulation section configured to modulate a phase of an output light using an injected third current;
    wherein each of the gain section, the phase shift section, and the phase modulation section includes a corresponding active layer, active layers of the gain section, the phase shift action, and the phase modulation section having mutually different refractive indexes, and the active layer of the phase shift section is formed with a material not absorbent of the light advanced from the gain section,
    wherein the gain section includes a stacked structure sequentially stacked with a first electrode, a P type or N type first semiconductor layer, a first active layer, a second semiconductor layer having a polarity opposite to a polarity of the first semiconductor layer, and a second electrode, wherein intensity of injected light is modulated by a first current injected to the first electrode,
    wherein the phase shift section includes a stacked structure sequentially stacked with a third electrode, a first polymer layer, a second active layer, a second polymer layer, and a fourth electrode, wherein the third electrode and the first electrode are mutually insulated by being discrete from each other, and
    wherein the phase modulation section includes a stacked structure sequentially stacked with a fifth electrode, a third polymer layer, a third active layer, and a sixth electrode, wherein the second and third active layers are active layers of same material.

2. The wavelength keeping F-P LD of claim 1, wherein the gain section, the phase shift section and the phase modulation section are serially laminated.

3. The wavelength keeping F-P LD of claim 1, wherein the gain section is spatially discrete from the phase shift section.

* * * * *